(12) United States Patent
Butash

(10) Patent No.: US 6,351,451 B1
(45) Date of Patent: Feb. 26, 2002

(54) DIGITAL MULTI-CHANNEL DEMULTIPLEXER/MULTIPLEXER (MCD/M) ARCHITECTURE

(75) Inventor: Thomas C. Butash, Centreville, VA (US)

(73) Assignee: BAE Systems Information and Electronic Systems Integration, Inc., Nashua, NH (US)

( * ) Notice: Subject to any disclaimer, the term of this patent is extended or adjusted under 35 U.S.C. 154(b) by 0 days.

(21) Appl. No.: 09/625,641

(22) Filed: Jul. 25, 2000

(51) Int. Cl.⁷ .................................. H04J 1/05
(52) U.S. Cl. ................... 370/210; 370/480; 364/724.16
(58) Field of Search ................ 370/210, 480, 370/203, 208, 260, 344, 484, 481; 364/724.16, 724.01, 728.03, 726.02

(56) References Cited

U.S. PATENT DOCUMENTS

| | | | |
|---|---|---|---|
| 4,131,766 A | * 12/1978 | Narashimha | 179/19 |
| 4,393,456 A | * 7/1983 | Marshall, Jr. | 364/724 |
| 4,754,449 A | 6/1988 | Crookshanks | 370/210 |
| 4,785,447 A | 11/1988 | Ichiyoshi | 370/210 |
| 4,792,943 A | 12/1988 | Gockler | 370/210 |
| 4,839,889 A | 6/1989 | Gockler | 370/210 |
| 4,896,320 A | 1/1990 | Gockler | 370/497 |
| 5,268,905 A | 12/1993 | Soloff | 370/210 |
| 5,293,329 A | 3/1994 | Wishart | 370/210 |
| 5,293,382 A | 3/1994 | Carson | 370/210 |
| 5,299,192 A | 3/1994 | Xiao et al. | 370/210 |
| 5,323,391 A | 6/1994 | Harrison | 370/210 |
| 5,396,489 A | 3/1995 | Harrison | 370/210 |
| 5,587,939 A | 12/1996 | Soleyamni et al. | 364/724.16 |
| 5,867,479 A | 2/1999 | Butash | 370/210 |
| 6,014,366 A | * 1/2000 | Ichiyoshi | 370/210 |
| 6,091,704 A | 7/2000 | Butash | 370/710 |

* cited by examiner

*Primary Examiner*—Douglas Olms
*Assistant Examiner*—Ken Vanderpuye
(74) *Attorney, Agent, or Firm*—Swidler Berlin Shereff Friedman, LLP

(57) ABSTRACT

A computationally efficient digital signal processing (DSP) system is provided for multiplexing/demultiplexing a large number of closely spaced FDM channels. Sub-band definition filtering divides the FDM channel band, comprised of N channels into K sub-bands, in order to reduce the dimension of polyphase filter fast-Fourier transform for completing the multiplexing/demultiplexing. This reduces the order of the required prototype by a factor proportional to K and allows small size, lightweight DSP implementations.

15 Claims, 9 Drawing Sheets

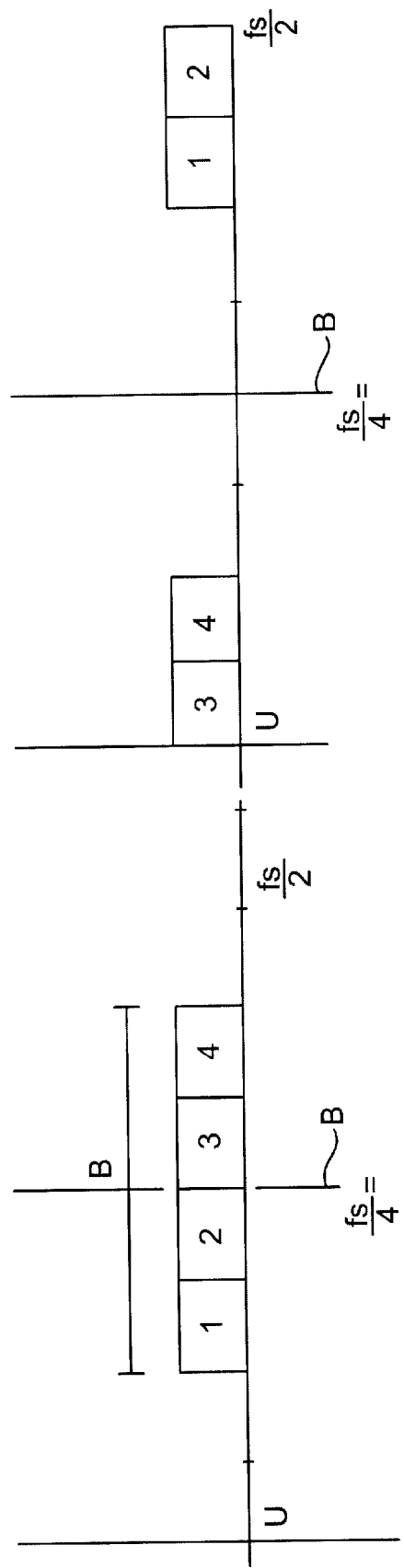

DIGITAL MULTI-CHANNEL DEMULTIPLEXER/MULTIPLEXER (MCD/M) ARCHITECTURE

CROSS-REFERENCE TO RELATED APPLICATION

This application is related to U.S. Pat. No. 6,091,704, filed Feb. 28, 2000, which is a continuation of U.S. Pat. No. 5,867,479.

BACKGROUND OF THE INVENTION

1. Field of the Invention

This invention relates to an improved digital signal processing method and apparatus for demultiplexing and multiplexing frequency division multiplexed channels and more particularly, to a lightweight, compact, low power system which synthesizes a polyphase filter, fast Fourier transform architecture suitable for use in applications with a large number of channels.

2. Related Art

In the prior art, digital polyphase filters (PPFs) are used in combination with fast Fourier transform (FFT) algorithms to efficiently demultiplex multiple, frequency division multiplexed (FDM) channels. Similarly, the polyphase filters are used in combination with inverse FFT algorithms to multiplex separate signals onto FDM channels. An N branch polyphase filter is realized by factoring (or partitioning) a desired prototype filter's transfer function (or impulse response) into N sub-filters. When coupled with an N point FFT (or IFFT) as shown in FIGS. 1 and 2, an N branch PPF can be used to implement a bank of N bandpass, N:1 decimating (or 1:N interpolating) filters for demultiplexing (or multiplexing) up to N FDM channels. The MCD/M thus realized represents the most computationally efficient system known for both demultiplexing and multiplexing large numbers of FDM channels.

The minimum order necessary to synthesize the required polyphase prototype filter is dictated by the ratio of the guard frequency band (separating adjacent FDM channels) to channel center frequency spacing, filter passband gain uniformity, channel cross-talk attenuation requirements, and the number, N, of FDM channels to be either demultiplexed or multiplexed. Given a fixed guard band to channel spacing ratio and fixed filter response requirements, the minimum order of the polyphase prototype filter grows linearly with N.

Cellular, Personal Communication Systems (PCSs) and other emerging telecommunications applications continue to demand increasingly larger numbers of ever more closely packed FDM communications channels. Such systems (e.g., satellite based cellular systems) often place stringent constraints on the power, mass and physical dimensions of the digital MCD/M subsystem designed to generate the constituent FDM communications channels. These constraints necessitate the use of short sample word lengths (e.g., from 8 to 12 bits) and fixed point arithmetic in any practically realizable MCD/M system for the applications in question. Short sample word lengths and fixed point arithmetic are, however, inherently incompatible with accurate, high order prototype filter realizations. Indeed, in some applications, the indicated (higher order prototype) polyphase filter may not even be physically realizable within the finite word length and fixed point arithmetic dimensions necessary to meet the MCD/M subsystem's power, mass and size constraints.

SUMMARY OF THE INVENTION

An object of this invention is the provision of a computationally efficient digital signal processing system, which synthesizes a polyphase filter-fast Fourier transform or a polyphase filter-FFT and inverse fast Fourier transform combination to respectively demultiplex or multiplex a large number of closely spaced FDM channels. That is, the provision of such a digital signal processing system that can be implemented as a small size, lightweight device with low power consumption for multiplexing and demultiplexing a large number of closely spaced FDM channels.

Briefly, this invention contemplates the provision of a digital signal processing system for multiplexing/demultiplexing a large number of closely spaced FDM channels in which sub-band definition filtering divides the FDM channel band comprised of "N" channels into "K" sub-bands in order to reduce the dimension of the polyphase filter-fast Fourier transform structure required to complete the multiplexing/demultiplexing. This reduces the order of the required prototype filter by a factor proportional to K. The number of sub-bands K is chosen so that it is large enough to ensure the polyphase filter-fast Fourier transform structure for each sub-band is realizable within a finite word length, fixed point arithmetic implementation compatible with a low power consumption. To facilitate efficient sub-band definition filtering, the real basebanded composite signal is inputted at a spectral offset from DC equal to one half the aggregate FDM channel bandwidth for the N channels and the signal is sampled at a frequency 100% greater than the applicable Nyquist rate. The half band spectral offset and oversampling by 100% above the theoretical Nyquist rate facilitate the use of computationally efficient bandshift and symmetric half-band Finite Impulse Response (FIR) filtering.

Further features and advantages of the invention, as well as the structure and operation of various embodiments of the invention, are described in detail below with reference to the accompanying drawings. In the drawings, like reference numbers generally indicate identical, functionally similar, and/or structurally similar elements. The drawing in which an element first appears is indicated by the leftmost digits in the corresponding reference number.

BRIEF DESCRIPTION OF THE DRAWINGS

The foregoing and other features and advantages will be better understood from the following detailed description of a preferred embodiment of the invention with reference to the drawings, in which:

FIG. 4 is an exemplary embodiment of an idealized diagram illustrating a real, composite FDM signal with spectral offset from DC equal to one half of the signal bandwidth;

FIG. 5 is an exemplary embodiment of an idealized diagram illustrating the complex representation of the signal shown in FIG. 4;

DETAILED DESCRIPTION OF AN EXEMPLARY EMBODIMENT OF THE PRESENT INVENTION

A preferred embodiment of the invention is discussed in detail below. While specific implementations are discussed, it should be understood that this is done for illustration purposes only. A person skilled in the relevant art can recognize that other components and configurations may be used without parting from the spirit and scope of the invention.

Figure 1:
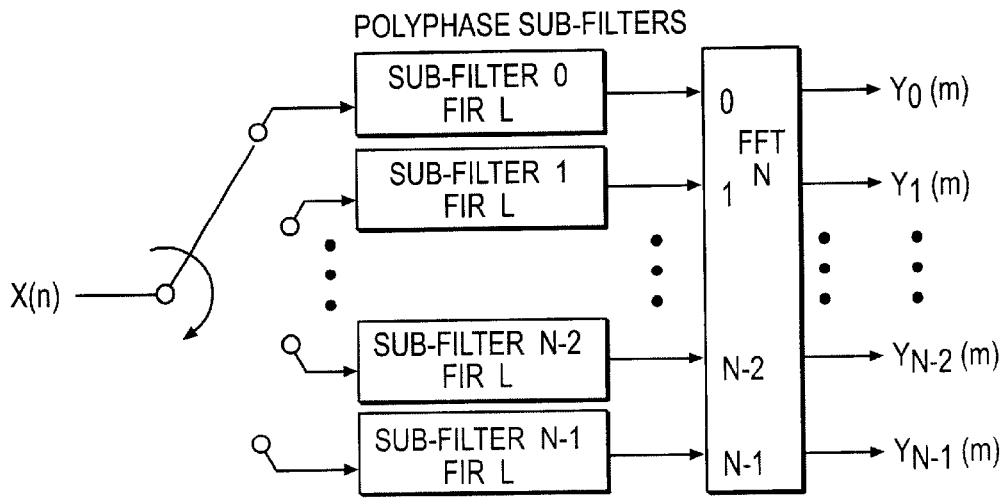
FIG. 1 is an exemplary embodiment of a functional block diagram of a prior art polyphase filter-fast Fourier transform (PPF-FFT) demultiplexer for an N channel FDM signal.
Figure 2:
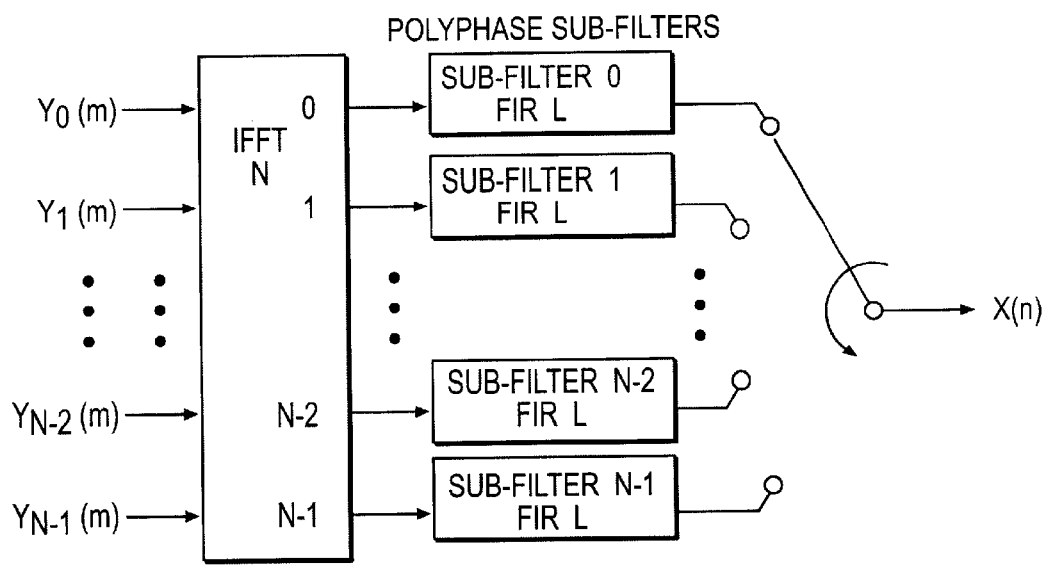
FIG. 2 is an exemplary embodiment of a functional block diagram of a prior art IFFT-PPF multiplexer for an N channel FDM signal.
Figure 3:
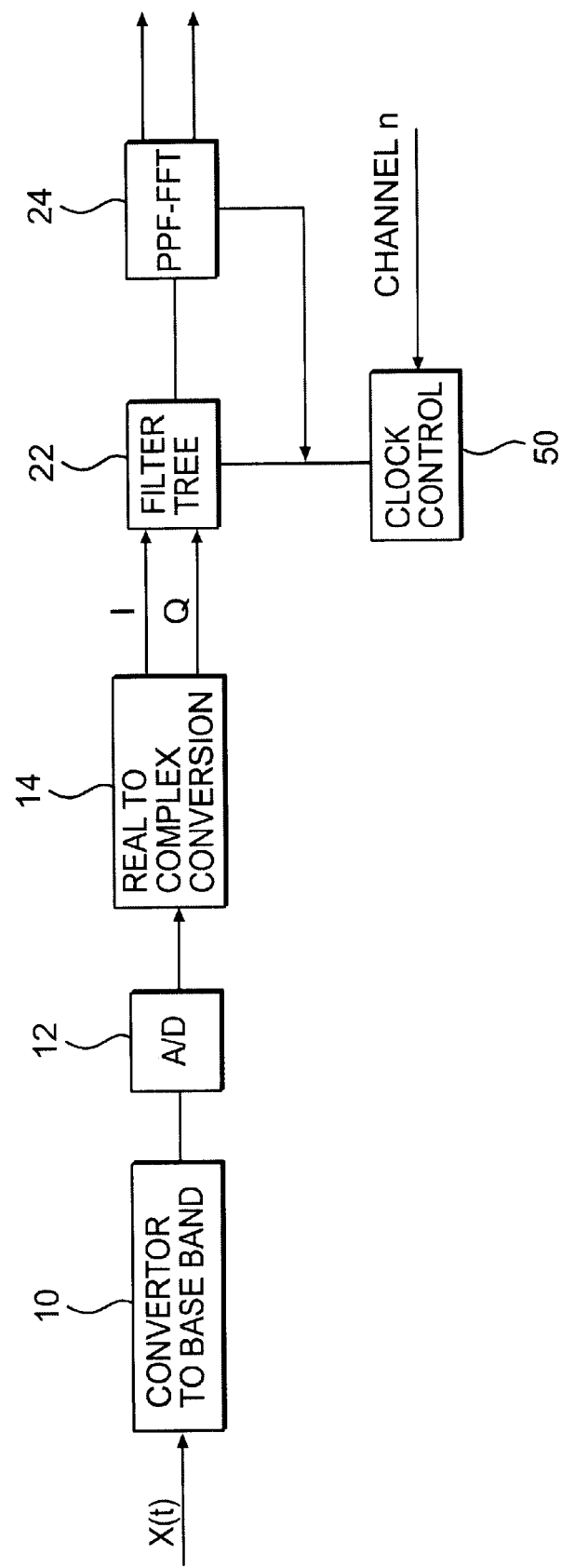
FIG. 3 is an exemplary embodiment of a simplified block diagram of an FDM demultiplexing system in accordance with the teachings of this invention.

Referring now to FIGS. 3 and 4, an RF, N channel FDM signal X(t) of bandwidth B is coupled to the input of an RF to baseband down convertor stage 10, which converts the received RF signal to a baseband signal off-set from DC by one half of the FDM signal bandwidth B, as illustrated in FIG. 4. That is, the center frequency of the basebanded signal is equal to the bandwidth B. As will be appreciated by those skilled in the art, prior art digital multi-channel multiplex and demultiplex signal processing systems accept their composite input signals, consisting of up to N constituent FDM communications channels, centered at a practical baseband intermediate frequency. Due to imperfections in analog bandpass and anti-aliasing filtering and mixing (frequency downconversion), it is usually necessary to offset the basebanded composite signal band from DC. In accordance with the teachings of this invention, the composite signal's basebanded spectral location and sampling frequency are chosen to maximize the efficiency of the subsequent digital MCD/M signal processing. The real basebanded composite signals are inputted to the digital signal processing stages at a DC spectral offset of one half of the composite FDM signal bandwidth and, an analogue to digital convertor 12 samples the composite input signal at a frequency that is 100% higher than the applicable Nyquist rate. This half band spectral offset and oversampling by 100% above the theoretical Nyquist rate facilitate the use of computationally efficient bandshift and symmetric half-band FIR filtering operations to generate and subsequently process the corresponding analytic signal.

A real-to-complex conversion processor 14 digitally generates a complex basebanded signal (illustrated in FIG. 5) in response to the oversampled, DC halfband offset output of A/D convertor 12. A functional block diagram of processor 14 is shown in FIG. 6.

Figure 6:
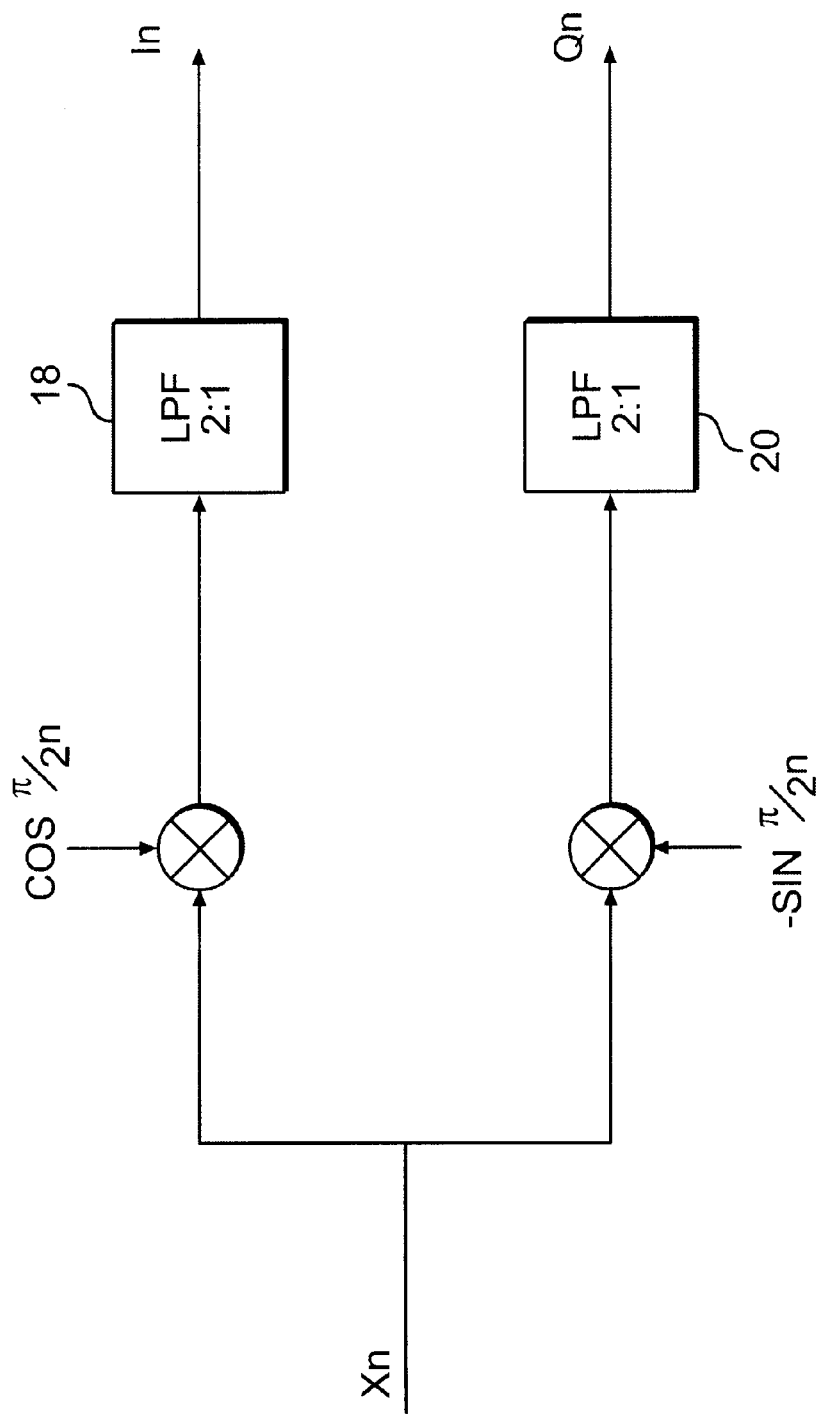
FIG. 6 is an exemplary embodiment of a functional block diagram of a real-to-complex conversion process for transforming the real composite FDM signal into its corresponding complex representation.

Referring now to FIG. 6, the real signal $x_n$ outputted from the A/D convertor 12 is (functionally) coupled as an input to two multipliers 15 and 17 where the signal $x_n$ is "multiplied" by the functions $\cos(\Pi/2)n$ and $-\sin(\Pi/2)n$ respectively. The outputs of the multipliers 15 and 17 are coupled as inputs to identical, low order, symmetric, half-band, 2:1 decimating, finite impulse response (FIR) filters 18 and 20. The real and quadrature outputs $I_n$ and $Q_n$ of the filters 18 and 20 are coupled as inputs to a filter tree 22, whose outputs in turn are coupled to a PPF-FFT 24, which demultiplexes each of the $2^k$ outputs of the final k stage filter tree. Filter tree 22 is coupled to a digital logic clock 50 for control and accepts feedback input from PPF-FFT 24.

Here it should be noted, the architecture's unique combination of input signal spectral location and sampling rate substantially reduces the complexity of this processing. The processor 14 (shown in FIG. 6) generates a digital, complex baseband signal with a simple half band complex bandshift (requiring no actual multiples; the indicated function of multiplication by $\cos(\Pi/2)n$ and $-\sin(\Pi/2)n$ can be performed by simply outputting the input sample $X_n$, the input sample with its sign changed, $-X_n$, or zero as appropriate), followed by a low order symmetric half-band 2:1 decimating FIR filter. The signal thus generated is equivalent to the complex input signal that would have been obtained from sampling the corresponding analog quadrature basebanded signal. The filter tree 22 and PPF-FFT 24 are designed to efficiently process this common, complex basebanded input signal.

Figure 7:
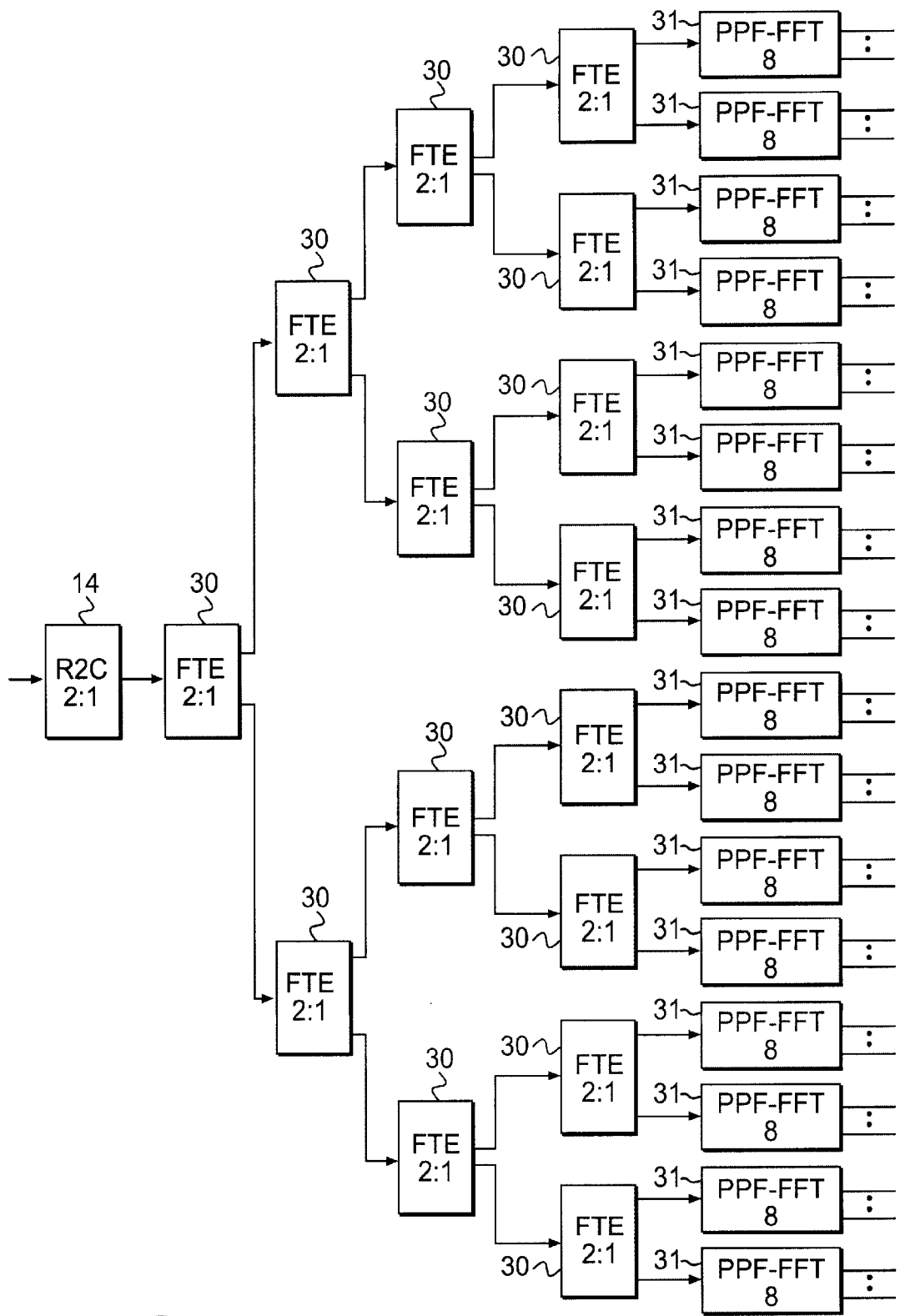
FIG. 7 is an exemplary embodiment of a functional block diagram of a filter tree and PPF-FFT demultiplexer stages in accordance with the teachings of this invention for a sixty-four channel FDM signal.

Referring now to FIG. 7 in addition to FIG. 3, the complex, basebanded composite signal from real to complex conversion processor 14 is processed by filter tree element (FTE) 30 through k stages of a band definition filtering and decimation to produce $2^k$ sub-band signals. In the illustrative embodiment of FIG. 7, k=4. Each sub-band signal is subsequently demultiplexed with an $N'=N/2^{k-1}$ channel PPF-FFT 31, where N is the dimension of the PPF-FFT structure that would have been required to demultiplex the original complex basebanded composite signal, without sub-band definition filtering, had it been sampled at the Nyquist rate.

The band definition filtering and decimation tree shown in detail in FIG. 7, is a tree-like structure of its serially concatenated Filtering Tree Elements (FTEs) 30. Each FTE 30 separates, and outputs, the lower and upper halves of its complex input signal's spectrum at half the input signal's sampling rate. At the output of the kth and final stage in the tree, the concatenated FTEs 30 have partitioned the original input signal band into $2^k$ sub-bands of equal bandwidth. Preferably, the smallest number of filtering tree stages, k, sufficient to ensure that the reduced dimension sub-band N' channel PPF is physically realizable, is used. In this specific example, four stages (k=4) are used to produce a sub-band (N'=8 channel) PPF to demultiplex a composite signal including 64 channels.

Figure 8:
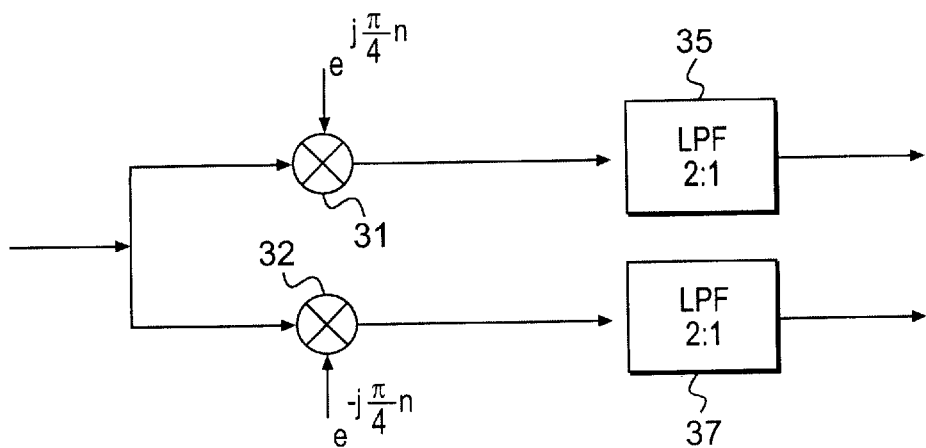
FIG. 8 is an exemplary embodiment of a functional block diagram of the filter tree elements used in FIG. 7.

The spectral location and sampling rate of the input signal produced by the real-to-complex conversion processor 14 minimize the computational complexity of the FTE 30. The FTE 30 is shown in FIG. 8. Multipliers 31 and 32, respectively, functionally multiply the input by $e^{j(\Pi/4)n}$ and $e^{-j(\Pi/4)n}$ i.e. relatively simple positive and negative one-fourth band bandshifts (requiring an average of only 8 real multiplies for every four complex input samples) followed by low order symmetric half-band 2:1 decimating FIR filters 35 and 37. FTE 30 is used throughout the band definition filtering and decimation tree—only the FTE's FIR coefficients change, and then only as necessary to meet filtering requirements uniquely encountered at the subject FTE's location.

Figure 9:
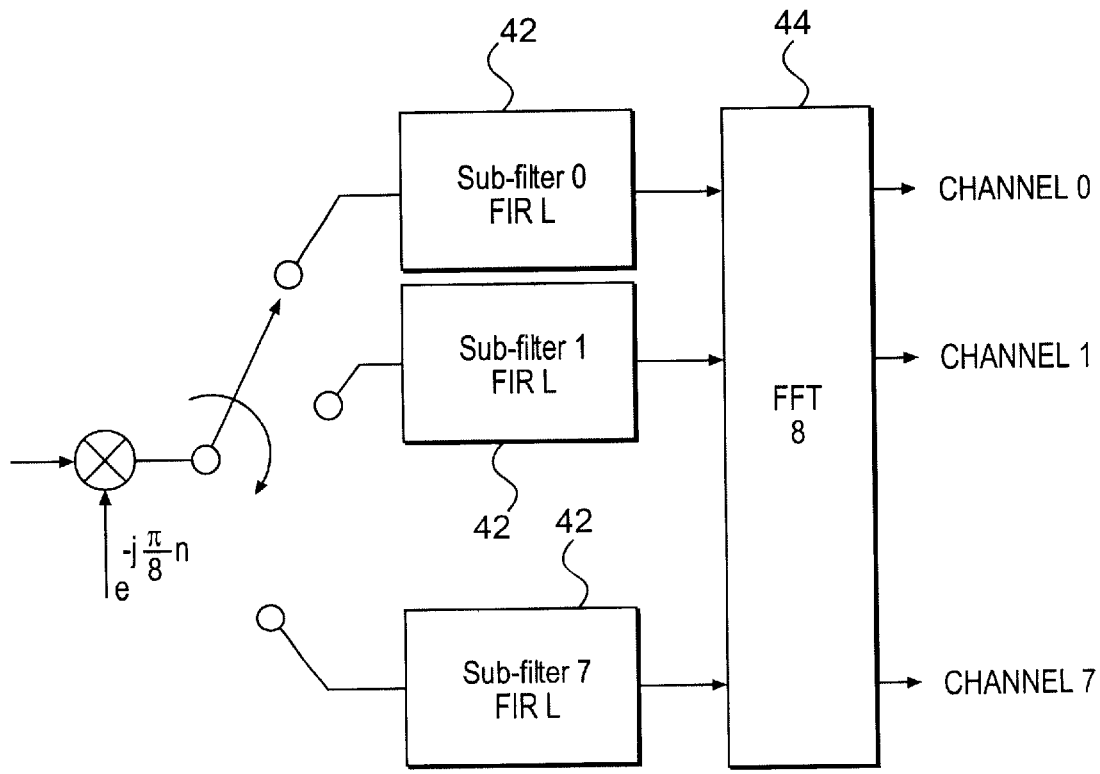
FIG. 9 is an exemplary embodiment of a functional block diagram of the final stage PPF-FFT 8 in FIG. 7.

The final stage FTEs 30 are coupled to an N' channel PPF-FFT 31 in order to demultiplex each sub-band and complete the demultiplexing process. In this specific exemplary embodiment of the invention, N'=8. As illustrated in FIG. 9, each PPF-FFT 31 is comprised of eight polyphase subfilters 42 whose outputs are coupled into an N' point FFT 44, with N'=8.

Here, it should be noted that additional power can be saved by energizing only those FTEs 30 in the tree that are in a path for demultiplexing a channel of interest. For example, if the FTEs 30 are implemented in CMOS, control 50 disables the clock signal to the FTEs 30 in some or all paths, other than the path which includes the channel or channels of interest, in order to reduce power consumption.

The corresponding MCM architecture, as illustrated in FIGS. 10–13, is the mirror image, symmetric implementation of the MCD system described in conjunction with FIGS. 3–9, with the corresponding components in FIGS. 10–13 designated by same reference with a prime. The MCD architecture's FTE 2:1, PPF-FFT N', and R2C elements are replaced by their dual counterparts: the FTE 1:2, FFT-PPF N' and C2R elements, as shown in FIGS. 10–13 respectively, in the MCM architecture.

Figure 10:
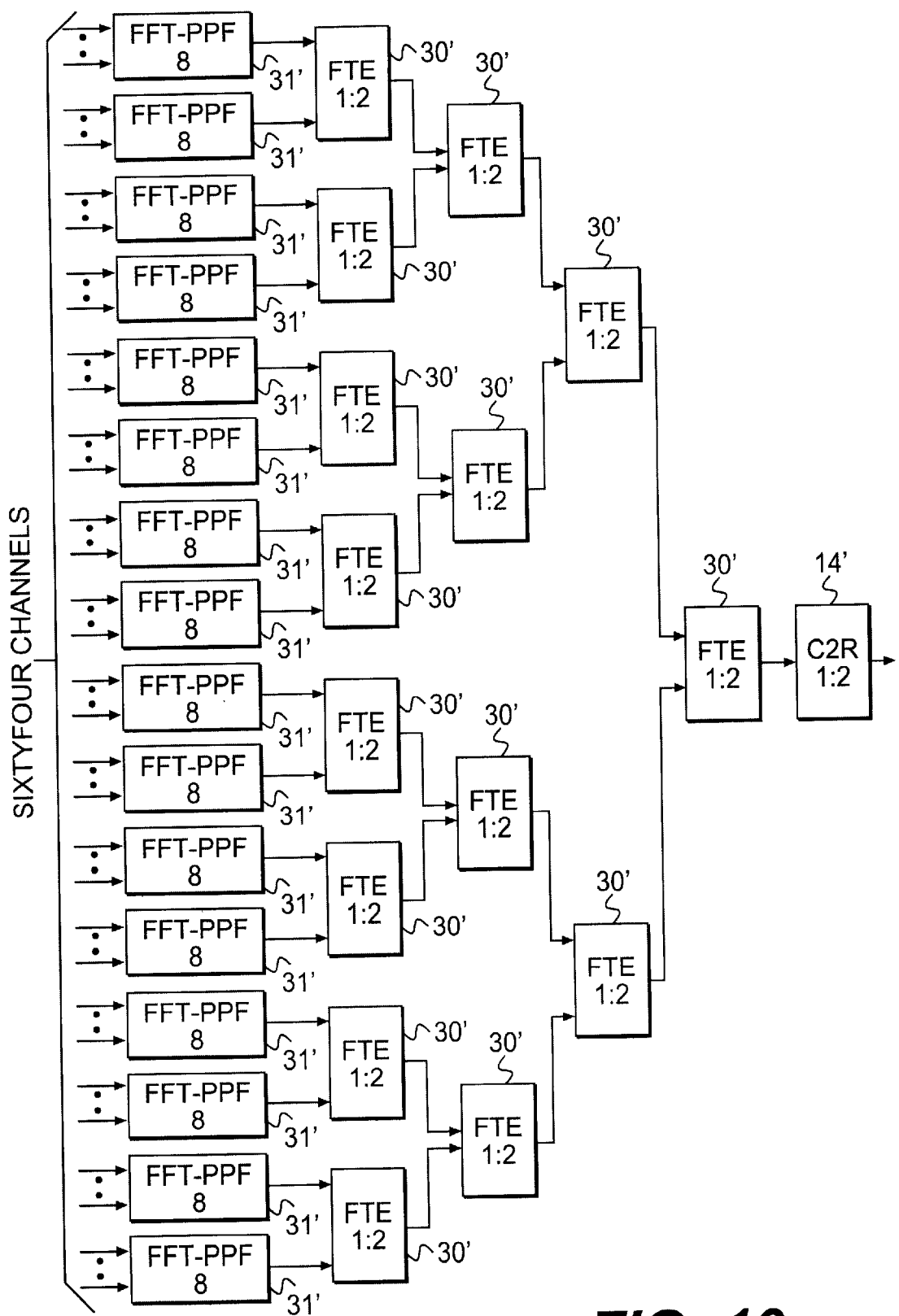
FIG. 10 is an exemplary embodiment of a functional block diagram similar to FIG. 7 of a multiplexer in accordance with the invention.
Figure 11:
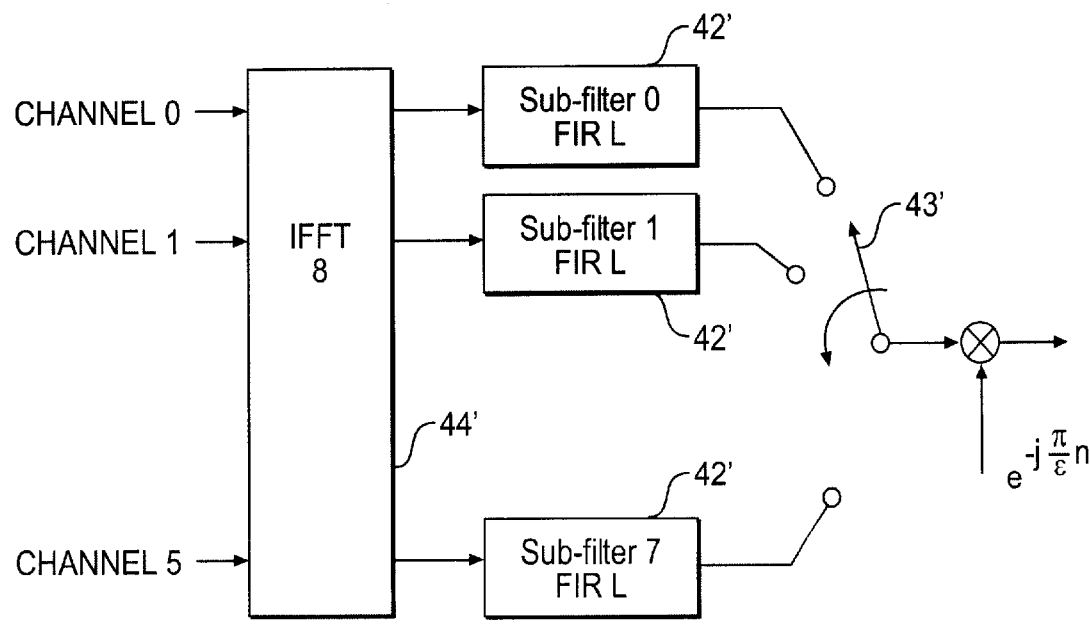
FIG. 11 is an exemplary embodiment of a functional block diagram of an IFFT-PPF 8 element shown in FIG. 10.

Briefly, now referring to FIGS. 10 and 11, in this illustrative embodiment of the invention, sixty four digital signal channels, which are to be multiplexed, are coupled, in sixteen groups of four, to IFFT-PPFs 31'(the values of frequency bins 2 through 5 are set equal to zero). The outputs of two IFFT-PPFs are inputs to the first stages of a filter tree comprised of filter tree elements 30'. Each IFFT-PPF 31' is comprised of a eight point inverse fast Fourier transform processor 44' with each output filtered by a finite impulse response polyphase subfilter 42'. Multiplexing switch 43' couples the outputs of the subfilters 42' to the input of the filter tree element 30'. The filter tree in this illustrative embodiment of the invention has four stages. Each stage combines and outputs the lower and upper halves of the output signal spectrum at twice the input signal sampling rate.

Figure 12:
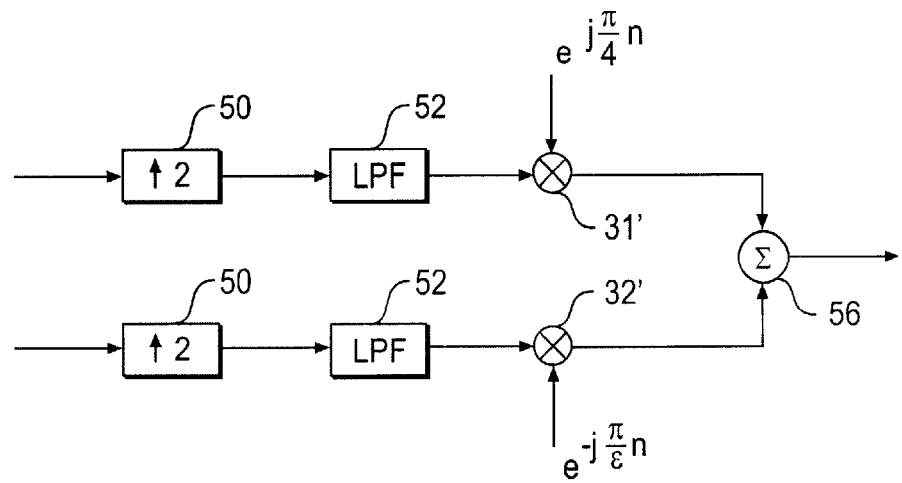
FIG. 12 is an exemplary embodiment of a functional block diagram of a filter tree element shown in FIG. 10.

Referring now to FIG. 12, each filter tree element 30' is comprised of one-to-two interpolating stages 50, low pass filters 52, multipliers 31' and 32', and a summing junction 56. Multipliers 31' and 32', respectively, (functionally) multiply the input by $$e^{j(\Pi/4)n}$$

and $$e^{-j(\Pi/4)n}$$

relatively simple positive and negative one-fourth band bandshifts (requiring an average of only 8 real multiplies for every four complex input samples).

Figure 13:
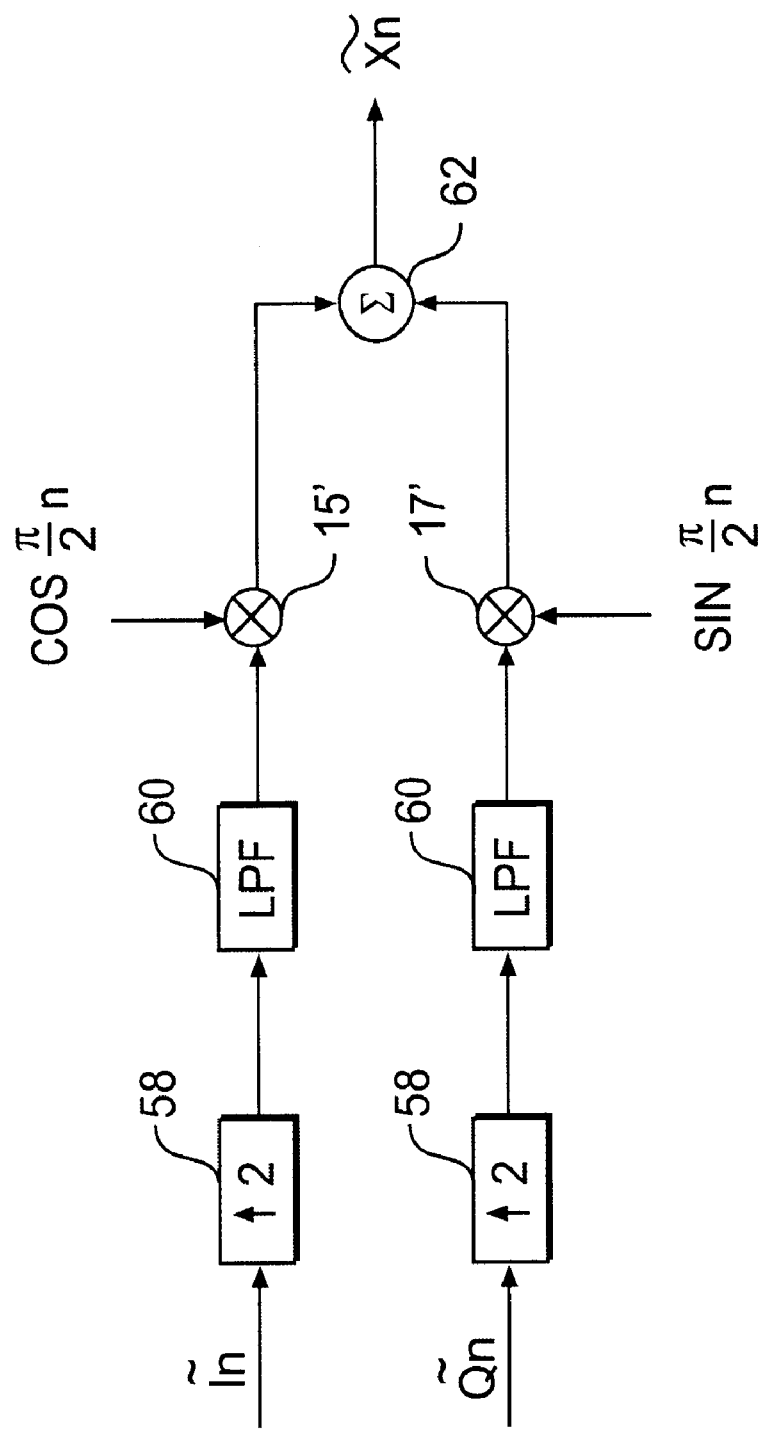
FIG. 13 is an exemplary embodiment of a functional block diagram of a complex to real conversion process element shown in FIG. 10.

Referring now to FIG. 13, the final stage of the filter tree is coupled to a complex to real conversion stage 14' comprised of one-to-two interpolating stages 58, low pass filters 60, multipliers 15' and 17', and summing junction 62, which concentrates the $2^k$ groups of $N/2^k$ into a single frequency division multiplexed complex digital signal. The output of the summing junction 62 is a real, digital, frequency division multiplexed signal of, in this illustrative example, the sixty four input channels.

While various embodiments of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents.

What is claimed is:

1. A method of demultiplexing a RF signal comprised of N frequency division multiplexed channels extending over a bandwidth B, including the steps of:

converting said RF signal to a baseband signal whose center frequency is offset from DC by an amount equal to the bandwidth B;

converting said baseband signal to a digital signal at a sampling rate four times the bandwidth B;

generating a complex baseband digital signal by a quarterband complex bandshift of said digital signal and filtering the quarterband complex bandshifted signal with a two to one decimating, symmetric, half-band finite impulse response filter;

dividing said complex digital signal into $2^k$ sub-bands by sub-band definition filtering in a k stage filter tree comprised of one-fourth band bandshifters and said two to one decimating symmetric, half-band finite impulse response filters; and demultiplexing each of the $2^k$ outputs of the final stage of said k stage filter tree with an N' channel polyphase-fast Fourier transform (FFT) filterbank where $N'=N/2^{k-1}$.

2. A method of demultiplexing a RF signal comprised of N frequency division multiplexed channels extending over the bandwidth B as in claim 1, wherein said quarterband complex bandshift of said digital signal is accomplished without the use of multipliers and each fourth bandshift, used in the sub-band definition filtering, is effected with four real multiplies for every two complex input signal samples.

3. A method of demultiplexing a RF signal comprised of N frequency division multiplexed channels extending over the bandwidth B as in claim 1, wherein a number of stages, k, of said sub-band definition filtering and said decimating filter is selected such that a dimension, N', of the resulting polyphase-FFT filterbank facilitates a realization of a structure within application imposed limits on implementation power and mass.

4. A method of demultiplexing a RF signal comprised of N frequency division multiplexed channels extending over the bandwidth B as in claim 1, wherein said demultiplexing is implemented as a digital demultiplexer in CMOS, and a digital logic clock is disabled in branches of said sub-band definition filtering and said decimating filter, which include inactive channels, thereby minimizing power consumption in applications exhibiting active channel sparsity.

5. A method of multiplexing N complex digital channel signals to synthesize a frequency division multiplexed signal extending over a bandwidth B, including the steps of:

multiplexing said N complex digital channels in $2^k$ groups of $N/2^k$ channels with an N' channel inverse fast Fourier transform (IFFT) phase filterbank where $N'=N/2^{k-1}$ and values of central $N/2^k$ frequency bins are set equal to zero;

concentrating said $2^k$ groups of $N/2^k$ into a single frequency division multiplexed complex digital signal in a k stage filter tree comprised of one to two interpolating, symmetric, half-band finite impulse response filters, one-fourth band bandshifters and a summation operation;

a real frequency division multiplexed digital signal by filtering said single frequency division multiplexed complex digital signal with a one to two interpolating, symetric, half-band, real finite impulse response filter and generating a real part of the quarterband complex bandshifted output of said finite impulse response filter.

6. A method of multiplexing N complex digital channel signals to synthesize a frequency division multiplexed signal extending over the bandwidth B as in claim 5, wherein said one-fourth band bandshifters, used in the k stage filter tree, are effected with four real multiplies for every two complex input signal samples, and said quarterband complex bandshift is accomplished without the use of multipliers.

7. The method according to claim 5, wherein a number of stages, k, of said filter tree is selected such that a dimension, N', of the resulting channel inverse IFFT-polyphase filterbank facilitates a realization of a structure within application imposed constraints on implementation power and mass.

8. The method according to claim 5, wherein said multiplexing is implemented as a digital multiplexer in CMOS, and a digital logic clock signal is disabled in branches of said k stage filter tree which contain no active channels, thereby minimizing power consumption in applications exhibiting active channel sparsity.

9. An apparatus for demultiplexing a RF signal comprised of N frequency division multiplexed channels extending over a bandwidth B, comprising:

a baseband down converter;

an analog-to-digital converter coupled to said baseband down converter;

a real-to-complex conversion processor coupled to said analog-to-digital converter, wherein outputs of said real-to-complex conversion processor are real and quadrature signal components;

a filter tree coupled to said real-to-complex conversion processor;

a digital logic clock to control said filter tree; and a PPF-FFT coupled to said filter tree, wherein said PPF-FFT also provides feedback input to said filter tree.

10. The apparatus according to claim 9, wherein said real-to-complex conversion processor further comprises:

two multipliers, which multiply a digital signal output by said analog-to-digital converter by the functions $\cos(\pi/2)n$ and $-\sin(\pi/2)n$ respectively; and a pair of identical low order symmetric, half-band, 2:1 decimating, finite impulse response filters, which output said real and quadrature signal components.

11. The apparatus according to claim 10, wherein said filter tree processes said real and quadrature signal components through k stages of band definition filtering and decimation to produce $2^k$ sub-band signals.

12. The apparatus according to claim 11, wherein the filter tree further comprises:

a plurality of filter tree elements, each of which includes two multipliers, which multiply an input by $e^{j(\Pi/4)n}$ and $e^{-j(\Pi/4)n}$; and a pair of identical low order symmetric, half-band, 2:1 decimating, finite impulse response filters, wherein the coefficients of said finite impulse response filters change to meet the filtering requirements encountered at the finite impulse response filter's unique location.

13. An apparatus for multiplexing N complex digital channel signals to synthesize a frequency division multiplexed signal extending over a bandwidth B, comprising:

a plurality of PPF-FFTs;

a filter tree coupled to said plurality of said PPF-FFTs;

a digital logic clock to control said filter tree;

a complex-to-real conversion stage coupled to said filter tree;

a digital-to-analog converter coupled to said complex-to-real stage; and a baseband up converter coupled to said digital-to-analog converter.

14. The apparatus according to claim 13, wherein the filter tree further comprises:

a plurality of filter tree elements;

two 1:2 interpolating stages;

a pair of low pass filters each coupled to one of said interpolating stages;

a pair of multipliers each coupled to one of said low pass filters, wherein each multiplier multiplies an input by $e^{j(\Pi/4)n}$ and $e^{-j(\Pi/4)n}$; and a summing junction coupled to said pair of multipliers.

15. The apparatus according to claim 14, wherein said complex-to-real conversion stage further comprises:

two 1:2 interpolating stages;

a pair of low pass filters each coupled to one of said interpolating stages;

a pair of multipliers each coupled to one of said low pass filters; and a summing junction coupled to said pair of multipliers, which concentrates the $2^k$ groups of $N/2^k$ into a single frequency division multiplexed complex digital signal.

* * * * *

UNITED STATES PATENT AND TRADEMARK OFFICE
CERTIFICATE OF CORRECTION

PATENT NO. : 6,351,451 B1  Page 1 of 1
APPLICATION NO. : 09/625641
DATED : February 26, 2002
INVENTOR(S) : Thomas C. Butash It is certified that error appears in the above-identified patent and that said Letters Patent is hereby corrected as shown below:

Column 1, item [63] lines 6-8, Cross-Reference Related Application should read as follows:

This application is related to U.S. Application No. 09/241,313, filed Feb. 1, 1999, now U.S. Pat. No. 6,091,704, issued Jul. 18, 2000 ~~July 28, 2000~~, which is a continuation of U.S. Application No. 08/884,650, filed Jun. 27, 1997, now U.S. Pat. No. 5,867,479.

Signed and Sealed this

Thirteenth Day of March, 2012

David J. Kappos
*Director of the United States Patent and Trademark Office*